United States Patent
Yoon et al.

(10) Patent No.: US 9,642,285 B2
(45) Date of Patent: *May 2, 2017

(54) POWER MODULES AND POWER MODULE ARRAYS HAVING A MODULAR DESIGN

(71) Applicant: Toyota Motor Engineering & Manufacturing North America, Inc., Erlanger, KY (US)

(72) Inventors: Sang Won Yoon, Ann Arbor, MI (US); Yuanbo Guo, Ann Arbor, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 65 days.

This patent is subject to a terminal disclaimer.

(21) Appl. No.: 14/465,264

(22) Filed: Aug. 21, 2014

(65) Prior Publication Data
US 2014/0362537 A1    Dec. 11, 2014

Related U.S. Application Data

(63) Continuation of application No. 13/652,037, filed on Oct. 15, 2012, now Pat. No. 8,847,384.

(51) Int. Cl.
H05K 7/20 (2006.01)
H01L 23/00 (2006.01)
H01L 23/473 (2006.01)

(52) U.S. Cl.
CPC ....... *H05K 7/20509* (2013.01); *H01L 23/562* (2013.01); *H05K 7/209* (2013.01);
(Continued)

(58) Field of Classification Search
CPC .................................. H05K 7/20509
See application file for complete search history.

(56) References Cited

U.S. PATENT DOCUMENTS 5,793,106 A * 8/1998 Yasukawa ........... H01L 23/3121
257/706
5,982,031 A   11/1999 Stockmeier
(Continued)

FOREIGN PATENT DOCUMENTS

JP    4355953    12/1992

OTHER PUBLICATIONS

Y. Ikeda, N. Nashida, M. Horio, H. Takubo, Y. Takahashi, "Ultra Compact, Low Thermal Impedance and High Reliability Module Structure with SiC Schottky Barrier Diodes", Proc. APEC'2011, pp. 1298-1300.
(Continued)

*Primary Examiner* — Robert Carpenter
(74) *Attorney, Agent, or Firm* — Dinsmore & Shohl LLP

(57) ABSTRACT

Power modules and power module arrays are disclosed. In one embodiment, a power module includes a module support, a high temperature module, and a module cap. The module support includes a frame member, a heat spreader, a first electrically conductive rail, and a second electrically conductive rail. The high temperature module includes a module substrate, a semiconductor device thermally and/or electrically coupled to a semiconductor surface of the module substrate, a first external connector, and a second external connector. The first and second electrically conductive rails are disposed within a through-hole of the first and second external connectors, respectively. The module cap includes a body portion, a plurality of posts, a first opening, and a second opening. The plurality of posts presses against at least the first external connector, the second external connector, and the module substrate such that the high temperature module is thermally coupled to the heat spreader.

13 Claims, 11 Drawing Sheets

(52) U.S. Cl.
CPC ............... *H01L 2224/48091* (2013.01); *H01L 2224/73265* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 6,084,772 | A | 7/2000 | Pell et al. |
| 6,870,738 | B2 | 3/2005 | Goebl |
| 7,151,311 | B2 | 12/2006 | Nakajima et al. |
| 7,327,024 | B2 | 2/2008 | Stevanovic et al. |
| 7,732,907 | B2 | 6/2010 | Han et al. |
| 7,859,846 | B2 | 12/2010 | Hassani et al. |
| 8,057,239 | B2 | 11/2011 | Campbell et al. |
| 8,076,696 | B2 | 12/2011 | Beaupre et al. |
| 8,130,499 | B2 | 3/2012 | Ohnishi et al. |
| 8,212,279 | B2 | 7/2012 | Lin et al. |
| 8,324,653 | B1 | 12/2012 | Lin et al. |
| 8,329,510 | B2 | 12/2012 | Lin et al. |
| 8,395,897 | B2 | 3/2013 | Yamada |
| 8,410,592 | B2 | 4/2013 | Otremba et al. |
| 8,415,703 | B2 | 4/2013 | Lin et al. |
| 8,421,214 | B2 | 4/2013 | Chou et al. |
| 8,502,365 | B2 | 8/2013 | Onishi |
| 8,502,385 | B2 | 8/2013 | Oka et al. |
| 8,514,579 | B2 | 8/2013 | Stolze et al. |
| 8,525,214 | B2 | 9/2013 | Lin et al. |
| 8,531,024 | B2 | 9/2013 | Lin et al. |
| 8,586,414 | B2 | 11/2013 | Xue et al. |
| 8,587,977 | B2 | 11/2013 | Nishikimi et al. |
| 8,847,384 | B2 * | 9/2014 | Yoon ............... H05K 7/209 165/80.2 |
| 2005/0161778 | A1 | 7/2005 | Morelle |
| 2007/0176266 | A1 | 8/2007 | Kawano et al. |
| 2010/0127392 | A1 | 5/2010 | Yang et al. |
| 2010/0127400 | A1 | 5/2010 | Kanschat et al. |
| 2010/0176498 | A1 | 7/2010 | Lee et al. |
| 2010/0193830 | A1 | 8/2010 | Lin et al. |
| 2010/0321896 | A1 | 12/2010 | Yamada |
| 2011/0156090 | A1 | 6/2011 | Lin et al. |
| 2011/0198662 | A1 | 8/2011 | Lin et al. |
| 2012/0140412 | A1 | 6/2012 | Shin et al. |
| 2013/0015495 | A1 | 1/2013 | Hauenstein |
| 2013/0242631 | A1 | 9/2013 | Inayoshi et al. |
| 2013/0314966 | A1 | 11/2013 | Sasayama |
| 2014/0029201 | A1 | 1/2014 | Yang et al. |
| 2014/0043765 | A1 | 2/2014 | Gohara et al. |

OTHER PUBLICATIONS

T. Ueda, N. Yoshimatsu, N. Kimoto, D. Nakajima, M. Kikuchi, T. Shinohara, "Simple, Compact, Robust and High-performance Power module T-PM (Transfer-molded Power Module)", in Proc. 22nd Int. Sym. Power Semiconductor Devices & ICs, 2010, pp. 47-50.

L. Ménager, C. Martin, B. Allard, V. Bley, "Industrial and lab-scale power module technologies: A review", IECON'2006, pp. 2426-2431.

M. Balucani, P. Nenzi, R. Crescenzi, L. Dolgyi, A. Klyshko, V. Bondarenko, "Transfer layer technology for the packaging of High Power Modules", Electronic System-Integration Technology Conference, 2010, pp. 1-6.

X. He, X. Zeng, X. Yang, Z. Wang, "A Hybrid Integrated Power Electronic Module Based on Pressure Contact Technology", in Power Electronics Specialists Conference, 2006, pp. 1-5.

U. Scheuermann, "Power Module Design without Solder Interfaces—an Ideal Solution for Hybrid Vehicle Traction Applications", APEC'2009, pp. 472-478.

N. Mattey, R. Skuriat, J. Li, P. Agyakwa, P. Evans, C.M. Johnson, "Thermal and Mechanical Design Optimization of a Pressure-Mounted Base—Plate-Less High Temperature Power Module", Electronic System-Integration Technology Conference, 2010, pp. 1-6.

L.D. Stevanovic, R.A. Beaupre, E.C. Delgado, A.V. Gowda, "Low Inductance Power Module with Blade Connector", APEC'2010, pp. 1603-1609.

Notice of Allowance in U.S. Appl. No. 13/652,037 mailed on Jun. 10, 2014.

* cited by examiner

POWER MODULES AND POWER MODULE ARRAYS HAVING A MODULAR DESIGN

CROSS-REFERENCE TO RELATED APPLICATIONS

This application is a continuation application of U.S. Non-Provisional application Ser. No. 13/652,037 filed Oct. 15, 2012 entitled "Power Modules and Power Module Arrays Having a Modular Design."

TECHNICAL FIELD

The present specification generally relates to power modules and, more particularly, to power modules having a modular design allowing for disassembly.

BACKGROUND

Heat generating devices, such as power semiconductor devices, may be coupled to a heat spreader to remove heat and lower the maximum operating temperature of the heat generating device. Typically, one or more semiconductor devices are permanently bonded to a substrate, which is then permanently bonded to a heat spreader, (e.g., metal plate, or a metal heat sink) to form a power module that may be incorporated into a power electronics circuit. However, because of the bonding of the various components, power modules cannot be easily reworked and repaired. In most cases, if one or more of the components of the power module fails, the entire module must be replaced. Further, multiple bonding processes may lead to high temperatures during fabrication, which may damage the semiconductor devices. Additionally, introduction of bonding layers may cause thermal mismatch between the bonding layers and the other components of the power module. High temperatures may also be present during operation of the semiconductor devices.

Accordingly, a need exists for alternative power modules that are easily disassembled and have a reduced number of bonding layers.

SUMMARY

In one embodiment, a power module includes a module support, a high temperature module, and a module cap. The module support includes a frame member, a heat spreader surrounded by the frame member, a first electrically conductive rail extending from a surface of a first edge of the frame member, and a second electrically conductive rail extending from a surface of a second edge of the frame member. The high temperature module includes a module substrate having a semiconductor surface and a heat transfer surface, a semiconductor device thermally and/or electrically coupled to the semiconductor surface of the module substrate, a first external connector electrically coupled to the semiconductor device, and a second external connector electrically coupled to the semiconductor device. The first and second electrically conductive rails are disposed within a through-hole of the first and second external connectors, respectively, such that the first external connector is electrically coupled to the first electrically conductive rail and the second external connector is electrically coupled to the second electrically conductive rail. The heat transfer surface of the module substrate contacts the top surface of the heat spreader. The module cap includes a body portion, a plurality of posts extending from the body portion, a first opening, and a second opening. The first and second electrically conductive rails are disposed within the first and second openings of the module cap. The plurality of posts press against at least the first external connector, the second external connector, and the module substrate such that the heat transfer surface of the high temperature module is thermally coupled to the heat spreader.

In another embodiment, a power module includes a module support, a high temperature module, and a module cap. The module support includes a frame member, a heat spreader surrounded by the frame member, a first electrically conductive rail extending from a surface of a first edge of the frame member, and a second electrically conductive rail extending from a surface of a second edge of the frame member. The high temperature module includes a module substrate having a first surface and a second surface, a first external connector, and a second external connector coupled to the first surface of the module substrate. The first and second electrically conductive rails are disposed within a through-hole of the first and second external connectors, respectively, such that the first external connector is electrically coupled to the first electrically conductive rail and the second external connector is electrically coupled to the second electrically conductive rail. The second transfer surface of the module substrate contacts the top surface of the heat spreader. The module cap includes a body portion, a plurality of posts extending from the body portion, a first opening, and a second opening. The first and second electrically conductive rails are disposed within the first and second openings of the module cap. The plurality of posts press against at least the first external connector, the second external connector, and the module substrate such that the heat transfer surface of the high temperature module is thermally coupled to the heat spreader. A first fastener is disposed about the first electrically conductive rail and contacts an upper surface of the body portion of the module cap, and a second fastener is disposed about the second electrically conductive rail and contacts the upper surface of the body portion of the module cap.

In yet another embodiment, a power module array includes a first power module and a second power module. Each of the first power module and the second power module includes a module support, a high temperature module, and a module cap. The module support includes a frame member, a heat spreader surrounded by the frame member, a first electrically conductive rail extending from a surface of a first edge of the frame member, and a second electrically conductive rail extending from a surface of a second edge of the frame member. The high temperature module includes a module substrate having a first surface and a second surface, a first external connector, and a second external connector coupled to the first surface of the module substrate. The first and second electrically conductive rails are disposed within a through-hole of the first and second external connectors, respectively, such that the first external connector is electrically coupled to the first electrically conductive rail and the second external connector is electrically coupled to the second electrically conductive rail. The second transfer surface of the module substrate contacts the top surface of the heat spreader. The module cap includes a body portion, a plurality of posts extending from the body portion, a first opening, and a second opening. The first and second electrically conductive rails are disposed within the first and second openings of the module cap. The plurality of posts press against at least the first external connector, the second external connector, and the module substrate such that the heat transfer surface of the high temperature module is thermally coupled to the heat spreader.

A first fastener is disposed about the first electrically conductive rail and contacts an upper surface of the body portion of the module cap, and a second fastener is disposed about the second electrically conductive rail and contacts the upper surface of the body portion of the module cap. The first power module is arranged vertically or laterally with respect to the second power module.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to power modules, such as power semiconductor modules, that may be included in high power circuit applications. As a non-limiting example, power modules may be included in inverter/converter circuits in electrified vehicles, such as hybrid electric vehicles, plug-in hybrid electric vehicles, electric vehicles, and the like. The embodiments described herein are configured as modular power modules that may be easily disassembled and reassembled as needed. More specifically, the power modules described herein include a module support, a high temperature module that is to be cooled, and a module cap. The module support may include a heat spreader to which the high temperature module is thermally coupled. Two or more electrically conductive rails extend from a top surface of a frame that defines the module support. The high temperature module is placed over the two or more electrically conductive rails such that a bottom surface contacts the heat spreader of the module support. The module cap includes several posts that contact various locations on the high temperature module and provide a downward force to secure the high temperature module to the module support.

In some embodiments, the module cap is secured to the module support by fasteners positioned about the electrically conductive rails. The power module may be easily disassembled by removing the fasteners, and pulling the module cap and the high temperature module away from the module support. As an example, if one of the semiconductor devices on the high temperature module fails, if one or more of the electrical connections on the high temperature module becomes broken, or any other malfunction occurs, a technician or other personnel may disassemble the power module, replace the one or more malfunctioning components, and reassemble the power module. In this manner, the entire power module does not need to be scrapped, and properly functioning components may be reused, thereby reducing repair costs. Various embodiments of power modules and power module arrays are described in detail below.

Figure 1:
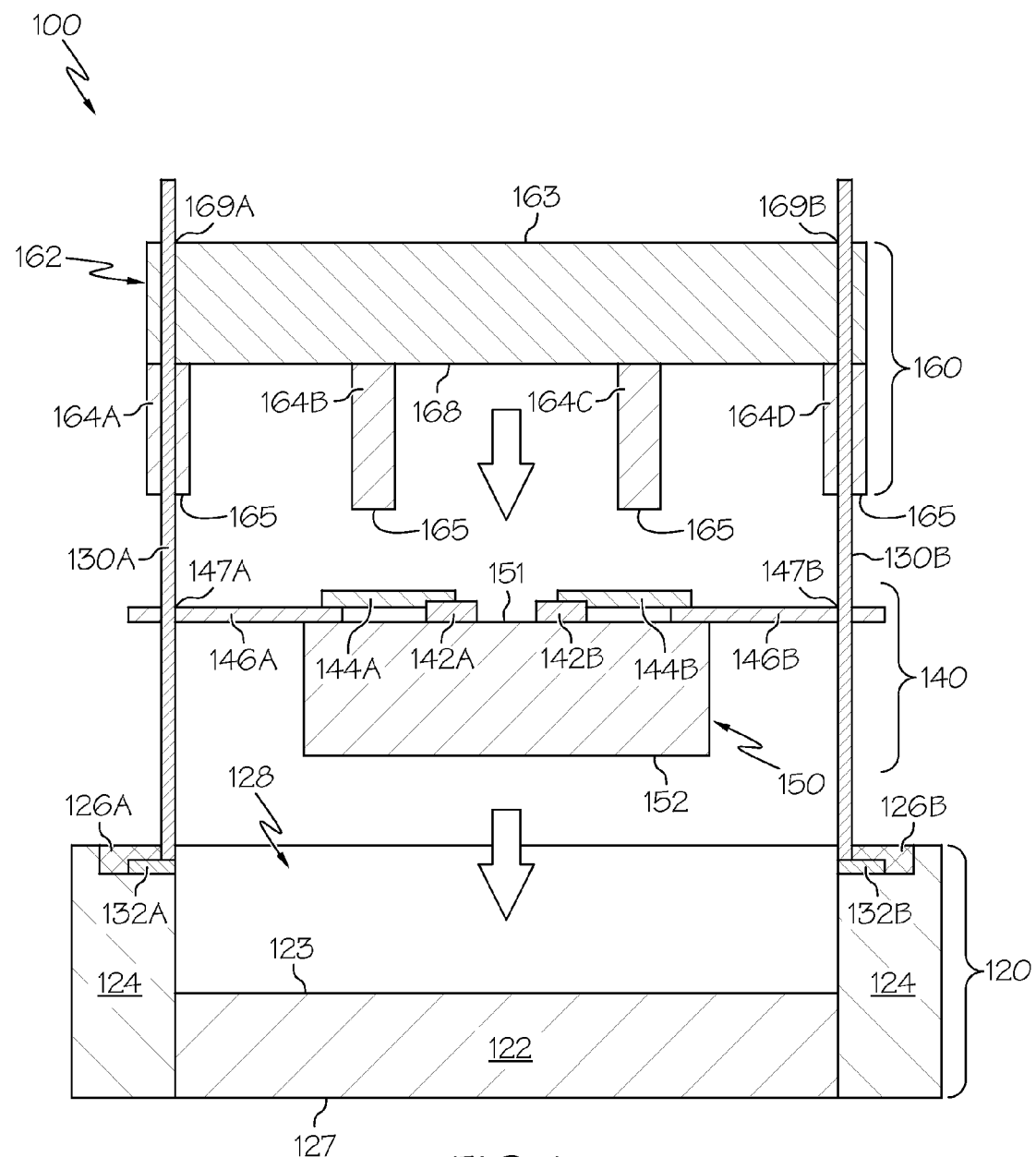
FIG. 1 schematically depicts a cross-sectional view of a power module in a partially assembled state according to one or more embodiments described and illustrated herein.
Figure 2:
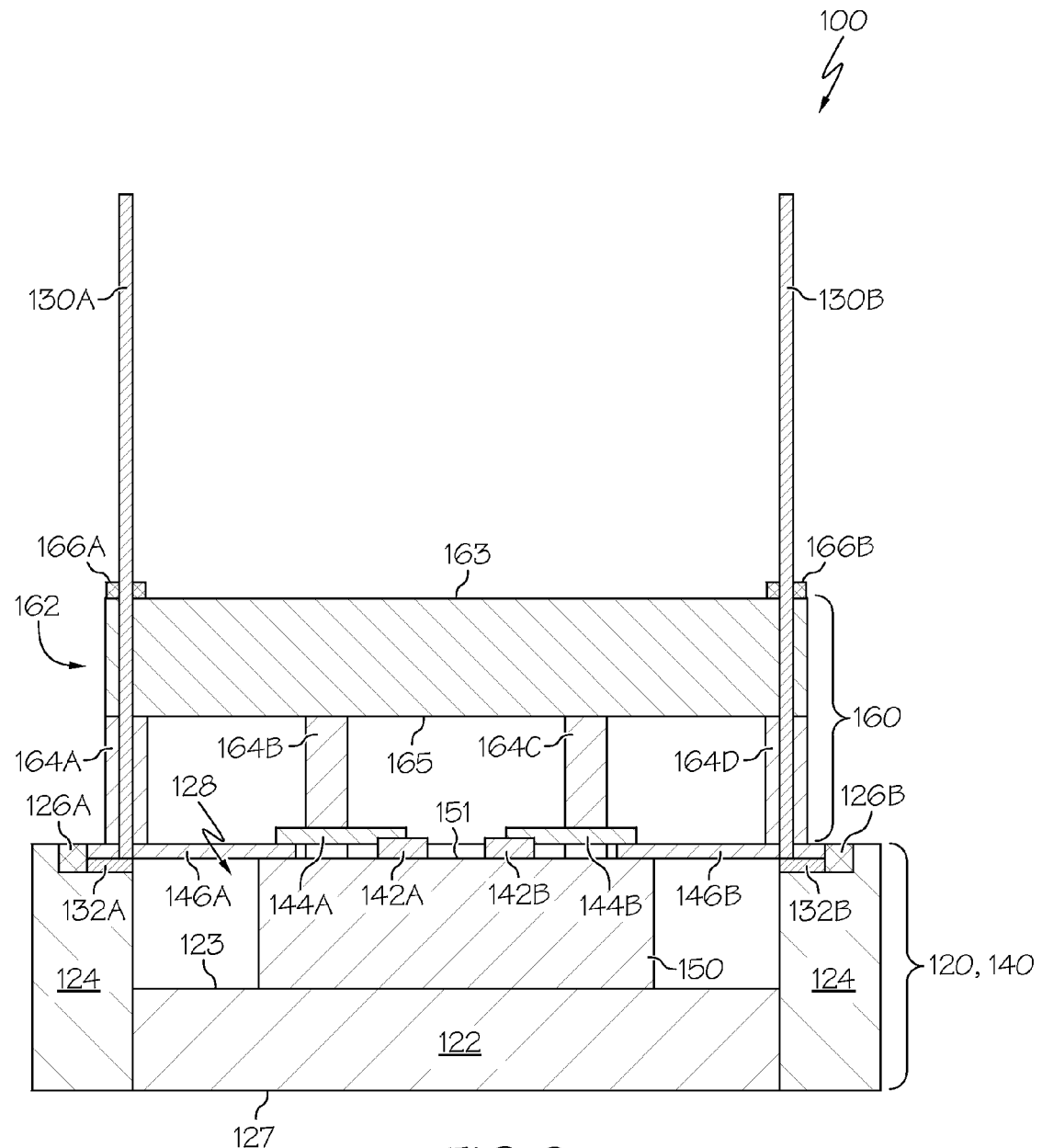
FIG. 2 schematically depicts a cross-sectional view of the power module depicted in FIG. 1 in an assembled state according to one or more embodiments described and illustrated herein.

Referring now to FIG. 1, a partially assembled power module 100 is schematically depicted in cross section. FIG. 2 depicts a fully assembled power module 100 and is described in more detail below. Generally, the power module 100 includes three main modules or components: a module support 120, a high temperature power module 140, and a module cap 160. As described in detail below, the module cap 160 assists in securing the high temperature power module 140 to the module support 120, which receives heat flux from the high temperature module 140. As indicated by the arrows, the high temperature power module 140 is disposed within the module support 120 on electrically conductive rails 130A, 130B. Similarly, the module cap 160 is also disposed on the electrically conductive rails 130A, 130B. The bottom surface 127 of the module support 120 may be further thermally coupled to a cooling module, such as a heat sink, a jet impingement cooling module, a two-phase cooling module, and the like. Each of the three main modules (module support 120, high temperature module 140, and module cap 160) will now be described in detail.

The high temperature power module 140 may be any module that is needed to be cooled. The high temperature power module 140 may include one or more semiconductor devices 142A, 142B that are thermally coupled to a module substrate 150. Although two semiconductor devices 142A, 142B are depicted in FIG. 1, more or fewer than two may be provided. The semiconductor devices 142A, 142B may include, but are not limited to, insulated-gate bipolar transistors (IGBT), power diodes, power metal-oxide semiconductor field-effect transistors (MOSFET), and the like. The power module 100 may be incorporated into larger power electronics systems, such as inverters for electrified vehicles, as described above. Although the exemplary power modules are described in the context of vehicular applications, embodiments are not limited thereto. The power modules described herein may be utilized in any application where power devices need to be cooled.

The semiconductor modules 142A, 142B are thermally coupled to a semiconductor surface (e.g., a top surface) of the module substrate 150. The semiconductor modules 142A, 142B may be coupled to the module substrate 150 in any manner that allows heat generated by the semiconductor devices 142A, 142B to be transferred to the module substrate 150. Exemplary coupling methods include, but are not limited to, soldering, sintering, brazing, and transient liquid phase bonding (TLP).

The module substrate 150 may be made of one or more layers that may receive the heat flux generated by the semiconductor devices 142A, 142B. In one embodiment, the module substrate 150 is made of an electrically isolative ceramic material, such as aluminum nitride, for example. Other materials may also be utilized.

Still referring to FIG. 1, the high temperature power module 140 further includes two or more electrically conductive external connectors 146A, 146B that are electrically coupled to the semiconductor devices 142A, 142B. In the illustrated embodiment, a first electrically conductive external connector 146A is electrically coupled to a top surface of a first semiconductor device 142A by a first bridge connector 144A, and a second electrically conductive external connector 146B is electrically coupled to a second semiconductor device 142B by a second bridge connector 144B. In other embodiments, the external connectors 146A, 146B may be coupled to the semiconductor devices 142A, 142B directly without a bridge connector. The external connectors 146A, 146B and the bridge connectors 144A, 144B may be made from any electrically coupled material, such as, but not limited to, copper and aluminum. It should be understood that any number of external connectors may be provided, depending on the design of the high temperature module.

The external connectors 146A, 146B include a through-hole 147A, 147B that is positioned near a distal edge from the center of the high temperature module 140. As described in more detail below, the through-holes 147A, 147B are provided to receive the electrically conductive rails 130A, 130B such that the high temperature module 140 may be positioned over the electrically conductive rails 130A, 130B for alignment and coupling purposes. The size and geometrical configuration of the through-holes may depend on the configuration of the electrically conductive rails 130A, 130B.

Figure 3A:
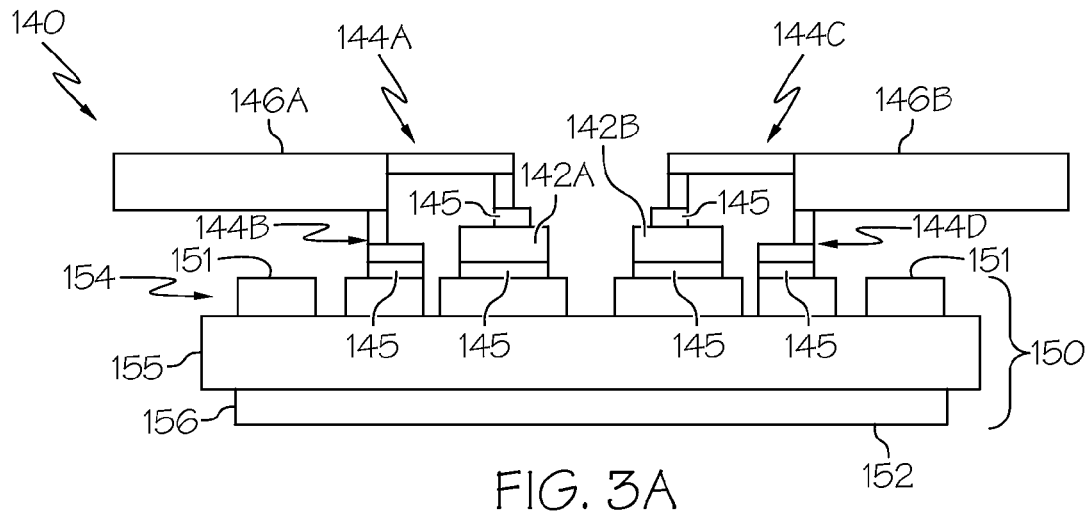
FIG. 3A schematically depicts a high temperature module according to one or more embodiments described and illustrated herein.
Figure 3B:
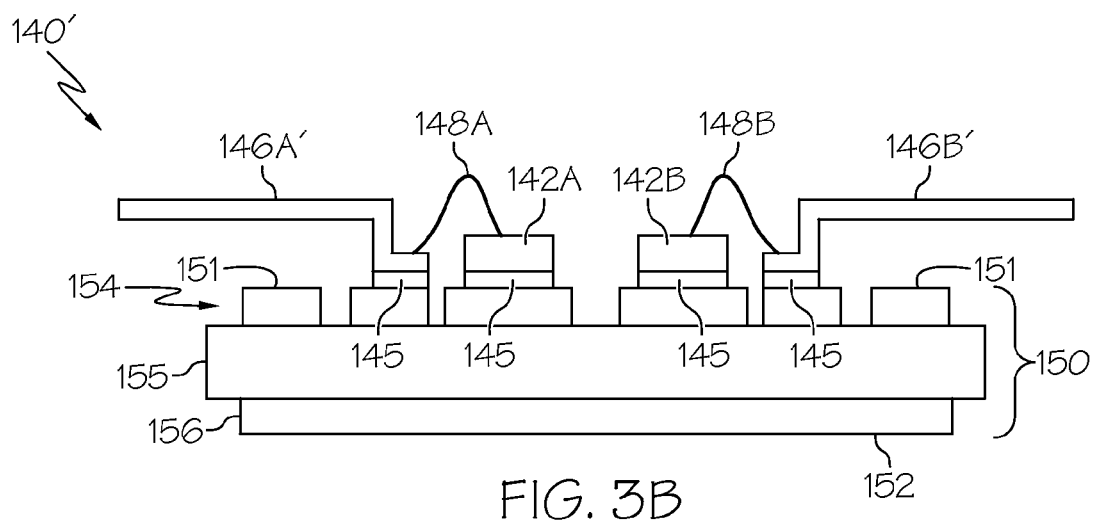
FIG. 3B schematically depicts another high temperature module according to one or more embodiments described and illustrated herein.
Figure 3C:
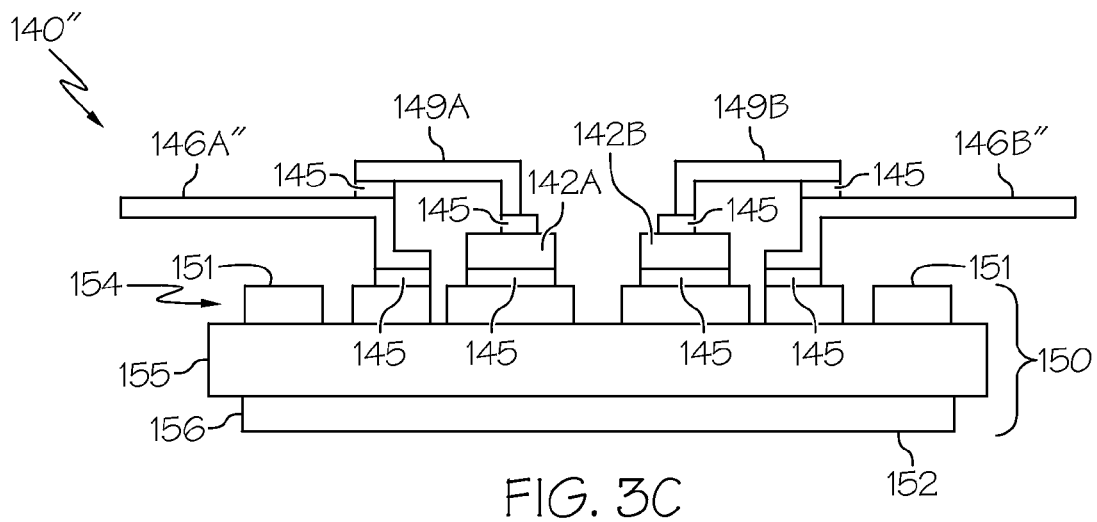
FIG. 3C schematically depicts another high temperature module according to one or more embodiments described and illustrated herein.

FIGS. 3A-3C depict three exemplary high temperature modules according to three different electrical coupling methods. Referring initially to the embodiment depicted in FIG. 3A, the module substrate 150 is configured as having a middle ceramic dielectric layer 155, a first metal layer 154 that defines the semiconductor surface 151, and a second metal layer 156 that defines a heat transfer surface 152. The three layers define a metal-ceramic-metal module substrate 150. In some embodiments, the first and second metal layers 154, 156 are directly bonded to the ceramic dielectric layer 155. It should be understood that other module substrate materials and configuration are also possible.

The first metal layer 154 may be patterned for electrical connections. More specifically, the first metal layer 154 defines several electrically isolated regions to which one or more of the external connectors 146A, 146B may be electrically coupled. For example, some of the electrically isolated regions of the first metal layer 154 may be connected to ground, others may be connected to a supply voltage, while yet others may be connected to control circuits. In this manner, the external connectors 146A, 146B may be connected to various connections of the semiconductor devices 142A, 142B by way of the first metal layer 154. It should be understood that FIGS. 3A-3C depict high temperature modules 140 simply in a schematic manner for illustrative purposes. The first metal layer 154 may take on more complicated configurations depending on the application.

In the embodiment depicted in FIG. 3A, the first external connector 146A is electrically coupled to the first semiconductor device 142A by first bridge connectors 144A, 144B, while the second external connector 146B is electrically coupled to the second semiconductor device 142B by second bridge connectors 144C, 144D. The bridge connectors 144A-144D may be metal pieces, for example. In other embodiments, the external connectors 146A, 146B and the bridge connectors 144A-144D are configured as unitary components. The first and second bridge connectors 144A-144D may be coupled to the first metal layer 154 and/or the first and second semiconductor devices 142A, 142B by a bonding layer 145 (e.g., a TLP layer, a solder layer, etc.). Similarly, the first and second semiconductor devices 142A, 142B may be thermally coupled to the first metal layer 154 of the module substrate 150 by a bonding layer 145.

Referring now to FIG. 3B, a high temperature module 140' having external connectors 146A', 146B' electrically coupled to the semiconductor devices 142A, 142B by wires 148A, 148B (wirebonding) is depicted. The module substrate 150 is configured as described above with respect to the embodiment illustrated in FIG. 3A. The external connectors 146A', 146B' are bonded to the first metal layer 154 by bonding layers 145. Electrically conductive wires 148A, 148B are used to electrically couple the external connectors 146A', 146B' to the semiconductors 142A, 142B. Lead frames 149A, 149B may also be used to connect the external connectors 146A'', 146B'' to the first metal layer 154, as shown in FIG. 3C.

Figure 4A:
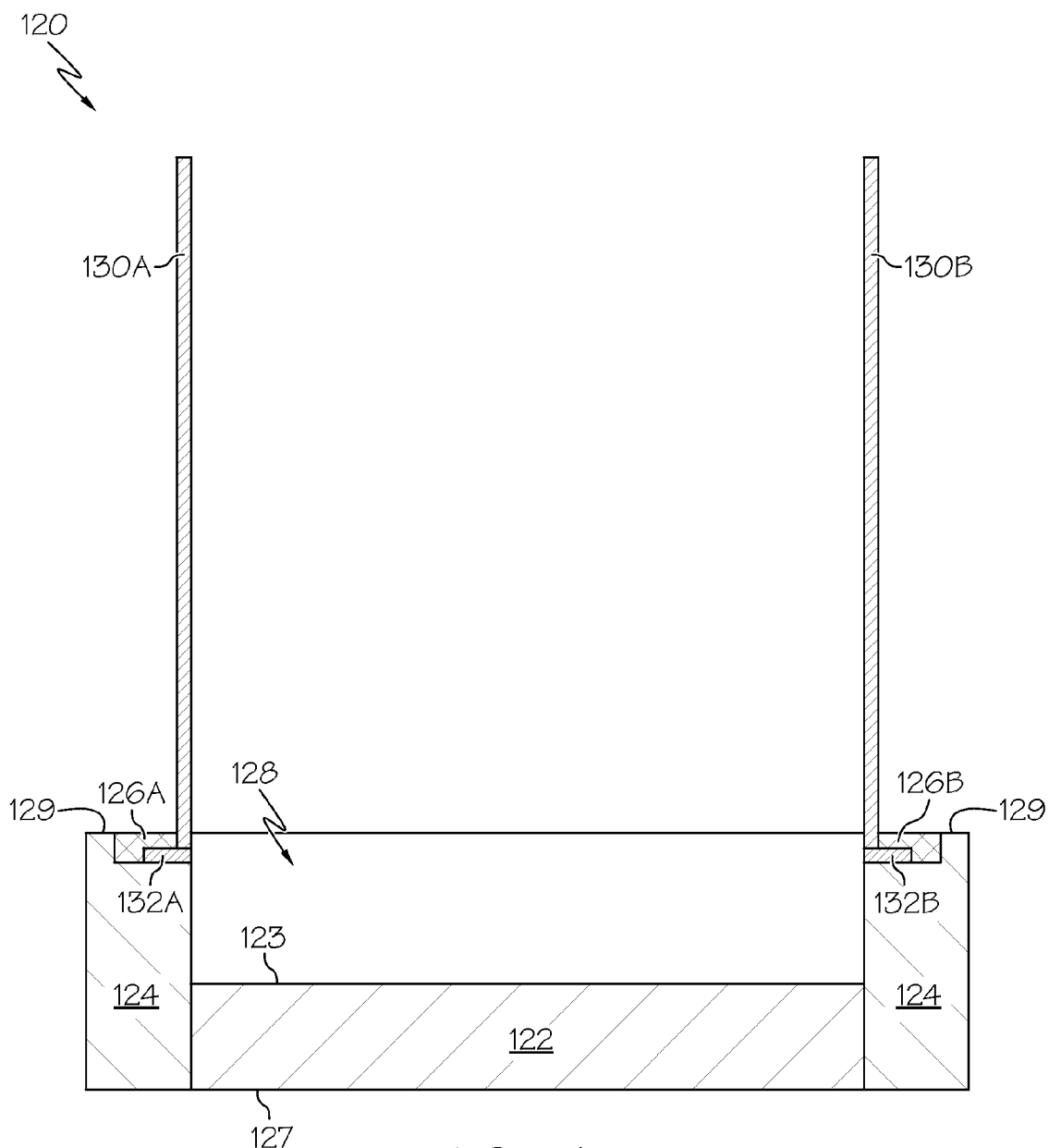
FIG. 4A schematically depicts a cross-sectional view of a module support according to one or more embodiments described and illustrated herein.
Figure 4B:
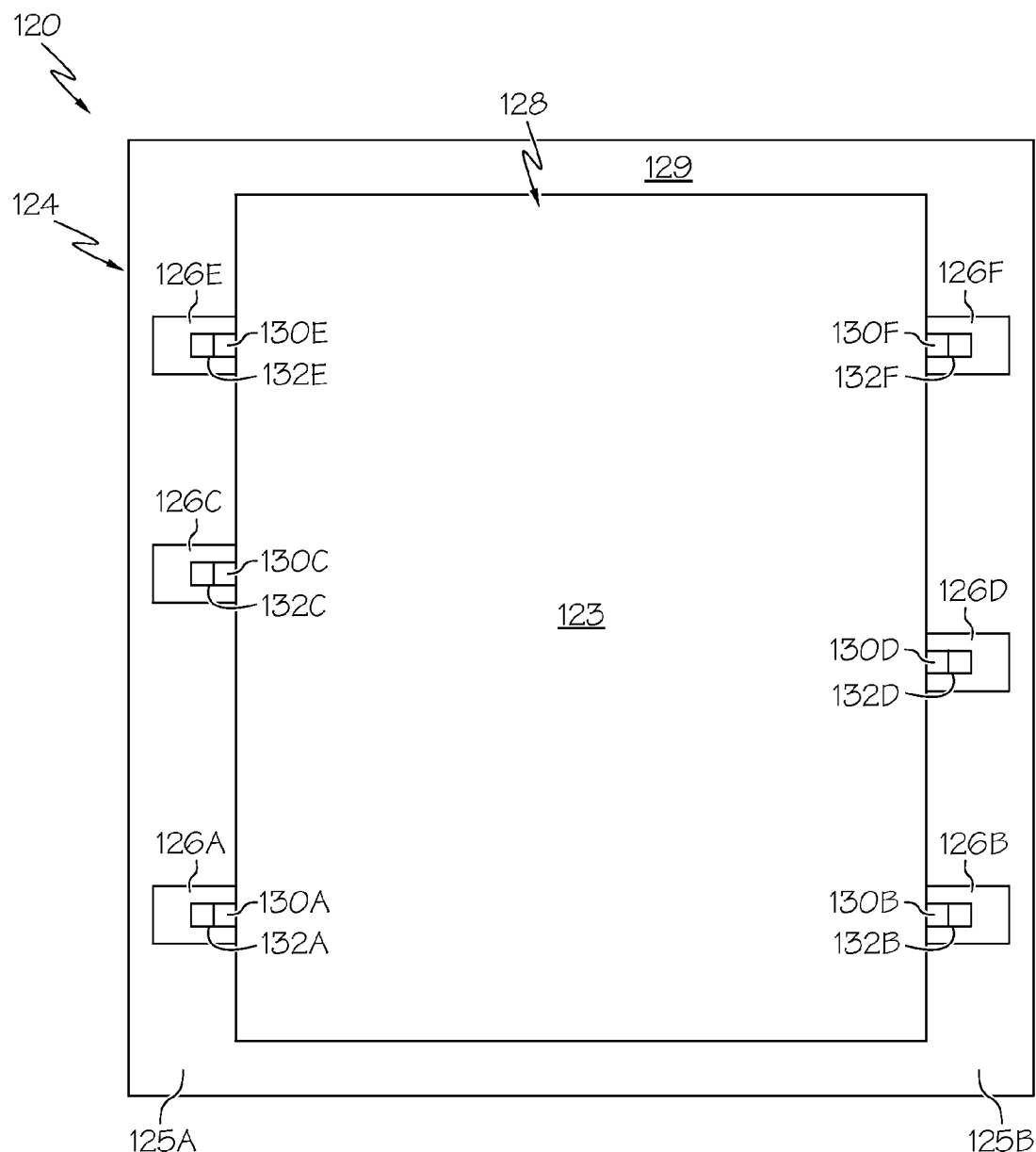
FIG. 4B schematically depicts a top view of a module support according to one or more embodiments described and illustrated herein.

FIG. 4A depicts a side cross-sectional view of an exemplary module support 120, while FIG. 4B depicts a top view of the exemplary module support 120 depicted in FIG. 4A. Referring generally to both FIGS. 4A and 4B, the module support 120 may include a frame member 124 that surrounds a heat spreader 122. The frame member 124 defines an opening 128 into which the high temperature module 140 may be disposed. A top surface 123 of the heat spreader 122 acts as a floor of the module support 120. The heat spreader 122 may be thermally conductive to receive heat generated by the high temperature module 140. In some embodiments, the heat spreader 122 is made of a thermally conductive metal, such as copper or aluminum, for example. The heat spreader 122 may also be made of other thermally conductive materials, such as thermally conductive polymers (e.g., metal matrix composites (MMC)). In some embodiments, the heat spreader 122 is configured as a heat sink having fins (not shown) to remove heat flux generated by the high temperature module 140.

In some embodiments, the frame member 124 may be electrically isolative, and fabricated from thermoplastics. However, the frame member 124 may be fabricated from any material. In some embodiments, the frame member 124 surrounds all or a portion of the bottom surface 127 of the heat spreader 122.

As stated above, the module support 120 may be thermally coupled to one or more additional cooling devices at the bottom surface 127. Cooling devices may include, but are not limited to, heat sinks, liquid cooling devices (e.g., jet impingement, two-phase, etc.), and the like.

The top surface 129 along the sides of the frame member 124 includes a plurality of recesses (e.g., recesses 126A and 126B) from which the electrically conductive rails (e.g., electrically conductive rails 130A, 130B) extend. Referring specifically, the FIG. 4B, the illustrated embodiment depicts recesses 126A, 126C, and 126E along a first edge 125A of the frame member 124, and recesses 126B, 126D, and 126F along a second edge 125B of the frame member 124. Six electrically conductive rails 130A-130F extend from the respective recess 126A-126F. It should be understood that any number of electrically conductive rails may be provided, and that embodiments are not limited by the location of the electrically conductive rails depicted in FIGS. 4A and 4B. In some embodiments, each electrically conductive rail is disposed through an individual external connector. In other embodiments, two or more electrically conductive rails are disposed through an individual external connector.

Also disposed within the recesses 126A-126F are electrically conductive pads 132A-132F that are electrically coupled to the electrically conductive rails 130A-130F. The electrically conductive pads 132A-132F may be provided to ensure electrical contact between the electrically conductive rails 130A-130F and the external connectors (e.g., external connectors 146A, 146B depicted in FIGS. 1 and 2). Therefore, a top surface of the electrically conductive pads 132A-132F should be exposed and accessible. In some embodiments, the electrically conductive pads 132A-132F are integral with the electrically conductive rails 130A-130F. For example, the electrically conductive pad may be a bent lower portion of the electrically conductive rail. In other embodiments, the electrically conductive pads 132A-132F are distinct from the electrically conductive rails 130A-130F (e.g., the electrically conductive rails 130A-130F are welded or otherwise bonded to the electrically conducive pads 132A-132F. The electrically conductive rails 130A-130F may be molded with the frame member 124 in some embodiments, or attached after the fabrication of the frame member 124.

The electrically conductive rails 130A-130F may be fabricated from any electrically conductive material, and should be rigid enough to support and align the high temperature module 140 without significant displacement. For example, the electrically conductive rails 130A-130F may be made of copper. However, other materials may be utilized. The electrically conductive rails 130A-130F may have more than one shape in cross-section such that the high temperature module 140 may be inserted in the module support 120 in only one, proper orientation (i.e., "keying"). As stated above, the electrically conductive rails 130A-130F may provide connections for ground, supply voltage, control voltage (e.g., gate signals), as well as diagnostic information, and may be electrically coupled to other components in an electrical system.

In some embodiments, a single high temperature module 140 may be disposed in the opening 128 of the module support 120. In other embodiments, more than one high temperature module 140 may be disposed in the opening 128. As an example and not a limitation, the external connectors of a first high temperature module may be disposed on electrically conductive rails 130A and 130B, the external connectors of a second high temperature module may be disposed on electrically conductive rails 130C and 130D.

Referring once again to FIG. 1, an exemplary module cap 160 will now be described in detail. The illustrated module cap 160 generally comprises a lateral body portion 162 having an upper surface 163 and a lower surface 168 from which a plurality of posts 164A-164D extend. The posts 164A-164D have an underside 165 and are placed and configured to contact various components of the high temperature module 140 when the module cap 160 is secured to the module support 120. It should be understood that more or fewer posts may be provided than what is depicted in FIG. 1. The posts 164A-164D may be fabricated from any suitably rigid material, such as metal, plastic, rubber, etc. In the illustrated embodiment, the module cap 160 includes a plurality of openings (e.g., first opening 169A and second opening 169B) that extend through the body portion 162 and any post that may be aligned with an opening. The plurality of openings is configured to receive the plurality of electrically conductive rails. For example, a first opening 169A extends through the body portion 162 and through a first outer post 164A, and a second opening 169B extends through the body portion 162 and through a second outer post 164B.

The posts 164A-164D are used to press on the external connectors 146A, 146B, the module substrate 150, the bridge connectors 144A, 144B, the semiconductor devices 142A, 142B, or other components of the high temperature module 140. Referring now to FIG. 2, an assembled power module 100 according to one embodiment is depicted. The module cap 160 is secured to the module support 120 at the electrically conductive rails (e.g., first fastener 166A secured to the first electrically conductive rail 130A and second fastener 166B secured to the second electrically conductive rail 130B).

In the illustrated embodiment, the first and second electrically conductive rails 130A, 130B are disposed within the first and second outer posts 164A, 164D, respectively, such that the first outer post 164A contacts and presses the first external connector 146A onto the first electrically conductive pad 132A, while the second outer post 164D contacts and presses the second external connector 146B to the second electrically conductive pad 132B. In some embodiments, the outer posts 164A, 164D are made of an electrically conductive material, such as aluminum or copper, to provide an electrical connection between the electrically conductive rails 130A, 130B, the electrically conductive pads 132A, 132B, and the external connectors 146A, 146B. In other embodiments, the outer posts 164A, 164D may be made of a non-conductive material, such as a thermoplastic material, or rubber, for example. The electrically conductive rails 130A, 130B, the recesses 126A, 126B and the electrically conductive pads 132A, 132B provide a guide for the high temperature module 140. The electrically conductive pads 132A, 132B inside of the recesses 126A, 126B allow a margin for assembly misalignment because slightly misaligned connectors of the high temperature module can be securely connected.

A first inner post 164B and a second inner post 164C are longer than the first and second outer posts 164A, 164D and are configured to press on an upper surface 151 of the module substrate 150 such that an underside, heat transfer surface 152 of the module substrate 150 is thermally coupled to the heat spreader 122. A thermally conductive interface material (e.g., thermal paste) may be disposed between the module substrate 150 and the heat spreader 122. The first and second inner posts 164B, 164C may be made from a non-electrically conductive material, such as thermoplastic or rubber, for example. In some embodiments, the first and second inner posts 164B, 164C (as well as the first and second outer posts 164A, 164D) deform slightly when the module cap 160 is secured to the module support 120. It should be understood that the module cap 160 may include additional posts that are not visible in the cross-sectional view provided by FIGS. 1 and 2.

Figure 5A:
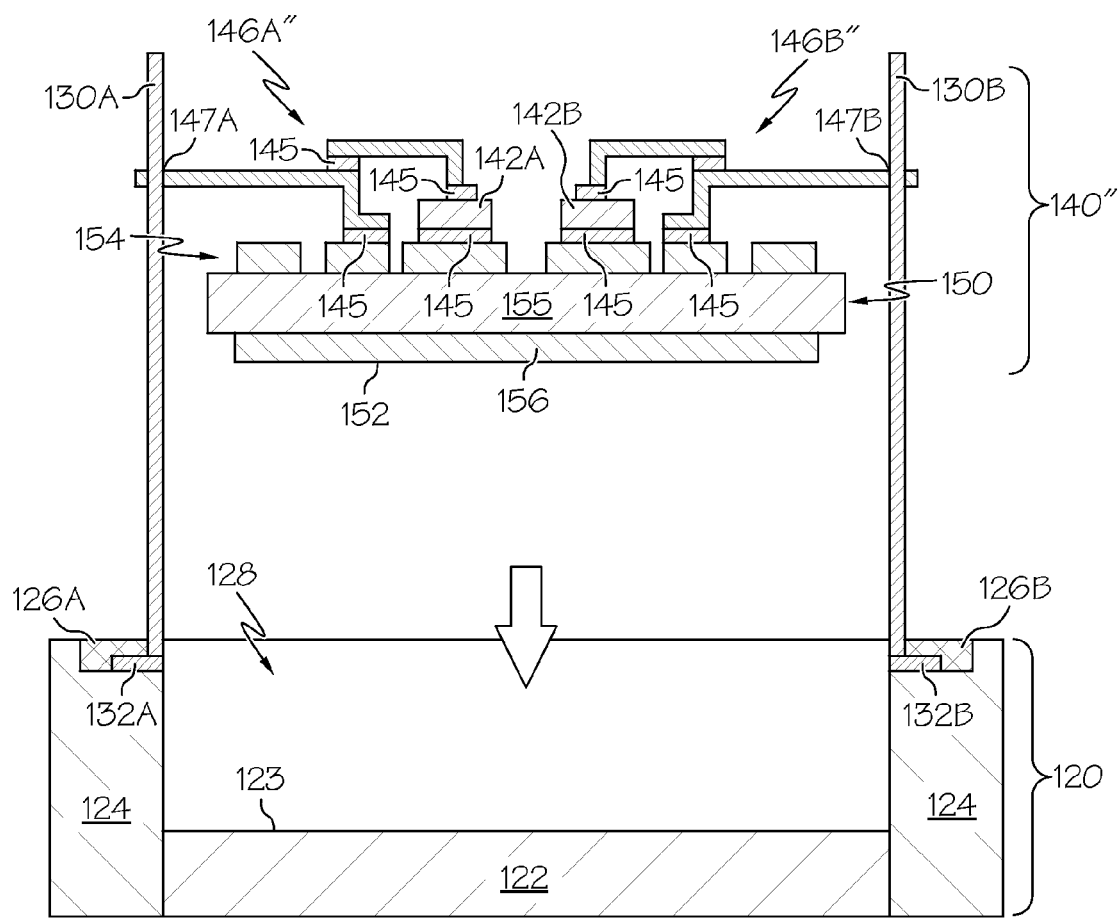
FIG. 5A schematically depicts a cross-sectional view of a high temperature module partially disposed on electrically conductive rails of a module support according to one or more embodiments described and illustrated herein.

Assembly of a power module 100 according to one embodiment will now be described. Referring to FIG. 5A, a high temperature module 140" may be positioned above the electrically conductive rails 130A, 130B. The exemplary high temperature module 140" is similar to the high temperature module 140" depicted in FIG. 3C. However, the high temperature module may take on any configuration. The high temperature module 140" is positioned such that the through-holes 147A, 147B are aligned within the electrically conductive rails 130A, 130B. The high temperature module 140" is then slid down the electrically conductive rails 130A, 130B as indicated by the arrow. It should be understood that the module support 120 may have additional electrically conductive rails that are not visible in FIG. 5A (e.g., electrically conductive rails 130C-130F depicted in FIG. 4B).

Figure 5B:
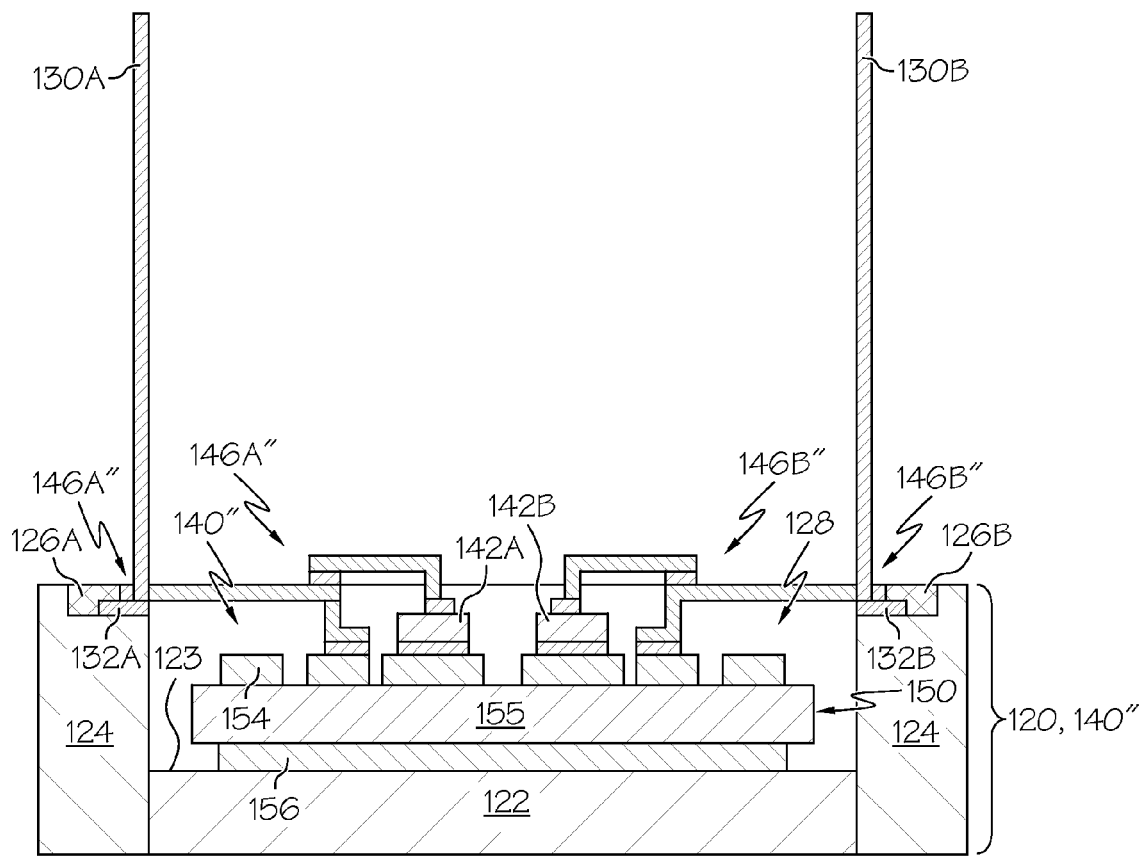
FIG. 5B schematically depicts a cross-sectional view of a high temperature module fully disposed on the electrically conductive rails of the module support depicted in FIG. 5A according to one or more embodiments described and illustrated herein.

FIG. 5B depicts the high temperature module 140" inserted into the opening 128 of the module support 120 on the electrically conductive rails 130A, 130B. The first external connector 146A" contacts the first electrically conductive pad 132A within a first recess 126A, and the second external connector 146B" contacts the second electrically conductive pad 132B within a second recess 126B. Additionally, the second metal layer 156 of the module substrate 150 contacts the heat spreader 122.

Figure 5C:
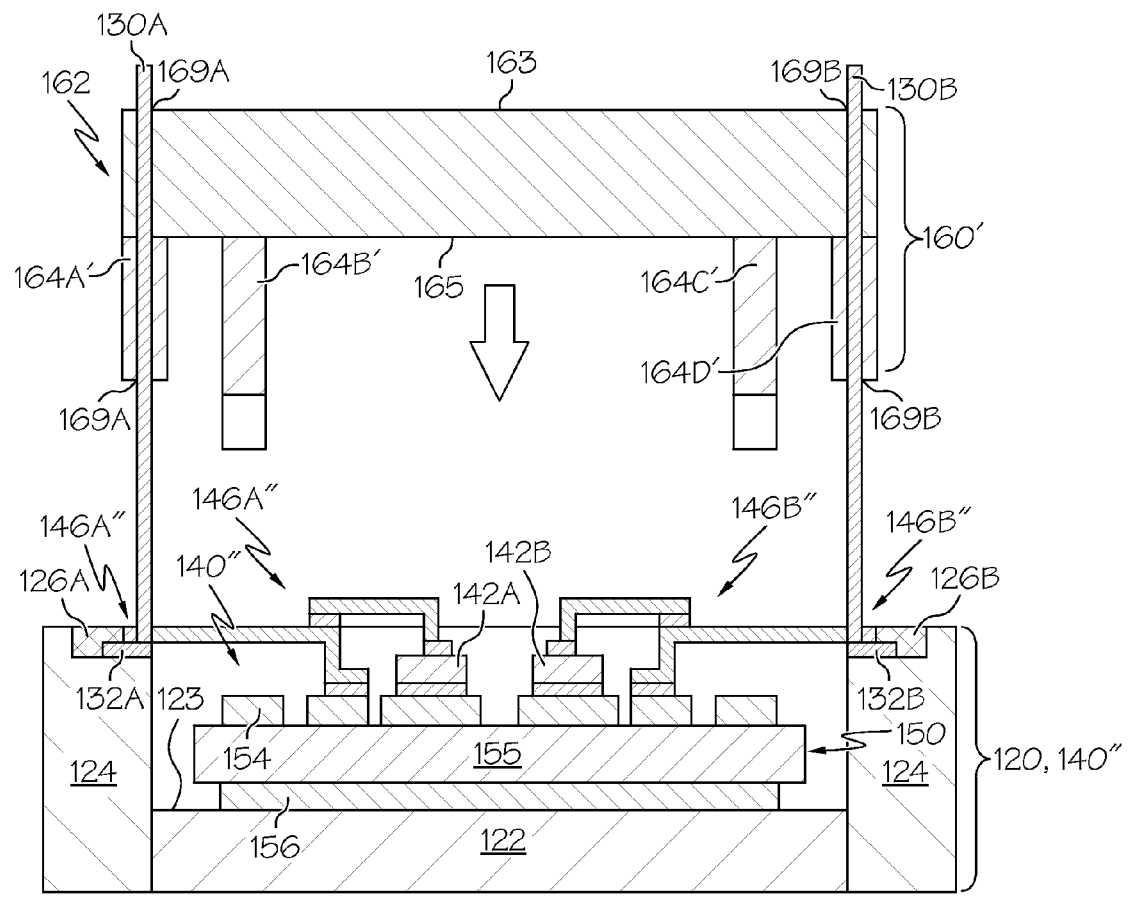
FIG. 5C schematically depicts a cross-sectional view of a module cap partially disposed on the electrically conductive rails of the module support depicted in FIG. 5B according to one or more embodiments described and illustrated herein.
Figure 5D:
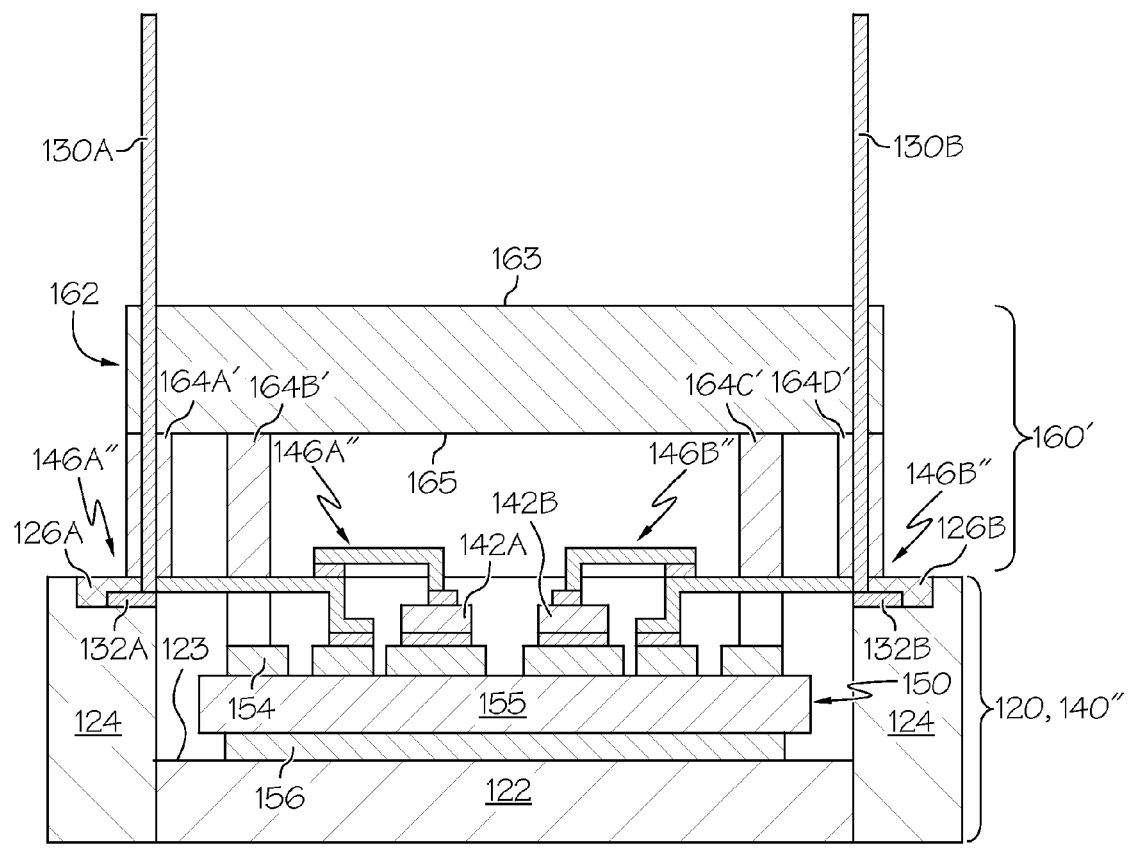
FIG. 5D schematically depicts a cross-sectional view of the module cap fully disposed on the electrically conductive rails of the module support depicted in FIG. 5C according to one or more embodiments described and illustrated herein.

Referring now to FIG. 5C, the module cap 160' may then be positioned over the module support 120 and the high temperature module 140" such that the electrically conductive rails 130A, 130B are aligned with the openings 169A, 169B through the outer posts 164A', 164D' and the body portion 162. It is noted that the module cap 160' depicted in FIG. 5C includes posts having a configuration that is different from the configuration of the module cap 160 depicted in FIGS. 1 and 2 to accommodate the external connectors 146A", 146B" of the high temperature module 140". The module cap 160' is then slid downward on the electrically conductive rails 130A, 130B as indicated by the arrow such that the first and second outer posts 164A', 164D' contact the first and second external connectors 146A", 146B", respectively, and the first and second inner posts 164B', 164C' contact the first metal layer 154 of the module substrate 150 (FIG. 5D).

Figure 5E:
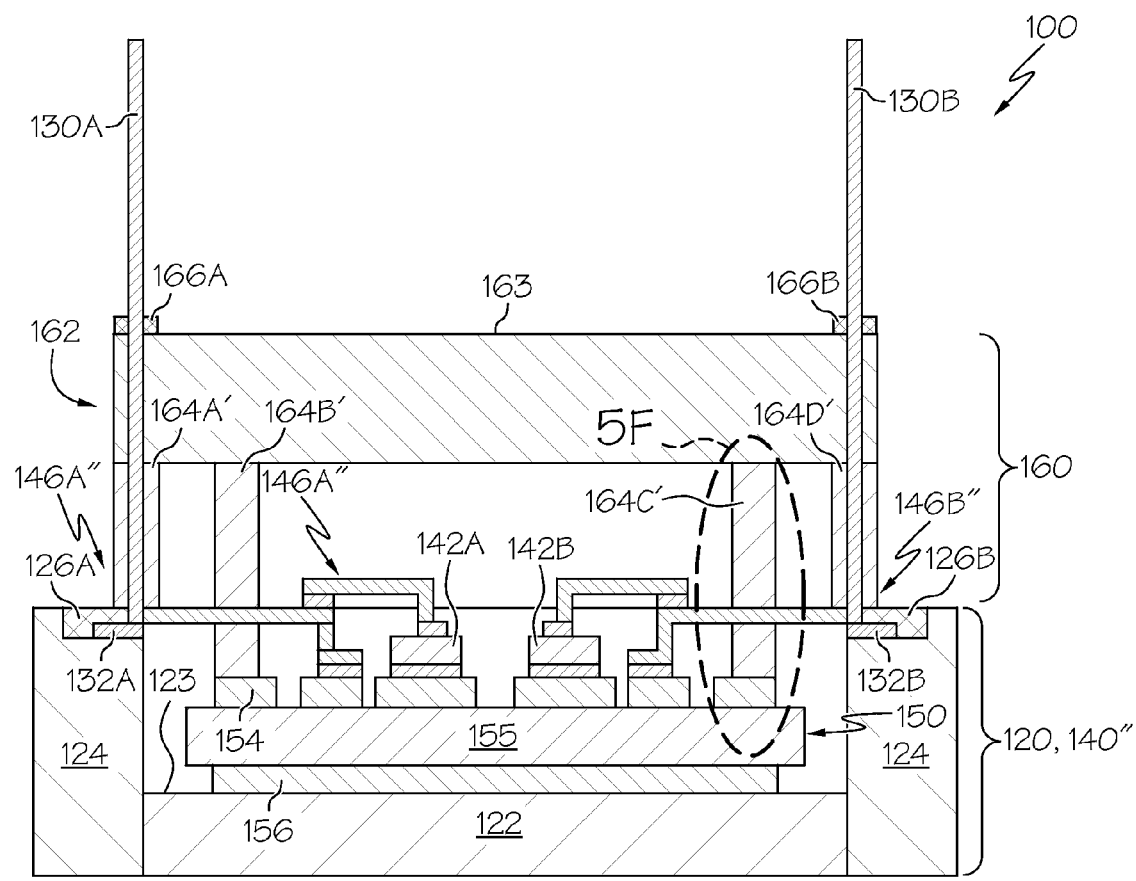
FIG. 5E depicts a cross-sectional view of a fully assembled power module according to one or more embodiments described and illustrated herein.

The module cap 160' may then be secured to the module support 120 by one or more fixing tools. Referring to FIG. 5E, in some embodiments the module cap 160' may be secured to the module support 120 by fasteners 166A, 166B, such as nuts, wing nuts, or other hardware, for example. As an example and not a limitation, the electrically conductive rails 130A, 130B may be at least partially threaded at the region close to the upper surface 163 of the body portion 162 of the module cap 160' such that fastener hardware may be applied. In other embodiments, one or more clamps (not shown) applied to the upper surface 163 of the body portion 162 and the frame member 124 may be used as the fixing tool. The fixing tool(s) act to press the posts 164A-164D against the high temperature module 140" to securely couple the high temperature module 140" to the module support 120. Accordingly, the posts 164A-164D apply a pressure to the high temperature module 140", thereby providing a robust connection between the high temperature module 140" and the module support 120.

Figure 5F:
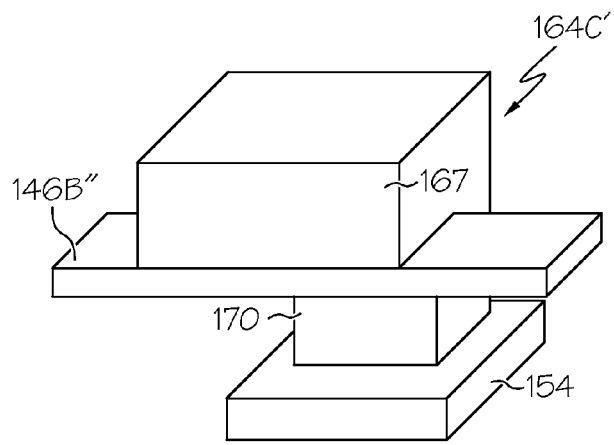
FIG. 5F depicts a partial perspective view of a module cap post according to one or more embodiments described and illustrated herein.

The first and second outer posts 164A', 164B' are pressed against the first and second external connectors 132A, 132B, respectively, such that the first and second external connectors 146A', 146B' are electrically connected to the first and second electrically conductive pads 132A, 132B and electrically conductive rails 130A, 130B. FIG. 5F schematically depicts a close up view of the encircled inner post 164C' depicted in FIG. 5E. In some embodiments, the first and second inner posts 164B', 164C' may be configured to contact both the first and second external connectors 146A", 146B", respectively, and the first metal layer 154 of the module substrate 150. Referring specifically to FIG. 5F, the second inner post 164C' has an upper portion 167 that extends beyond a wall of a lower portion 170 such that the upper portion 167 contacts the second external connector 146", while the lower portion 170 contacts the first metal layer 154. Any of the inner posts may be configured to contact both an external connector as well as the module substrate 150 (e.g., first inner post 164B and any other inner posts that may be present and not visible in FIG. 5E). In alternative embodiments, the upper portion 167 is positioned over an external connector (e.g., external connector 146") but does not contact it.

To disassemble the power module 100, such as to repair one or more components, for example, the fixing tool(s) 166A, 166B may be removed from the assembly, and the module cap 160' and high temperature module 140" slid off the electrically conductive rails 130A, 130B. The damaged components may be replaced or repaired, and the power module 100 may be reassembled as described above.

Figure 6:
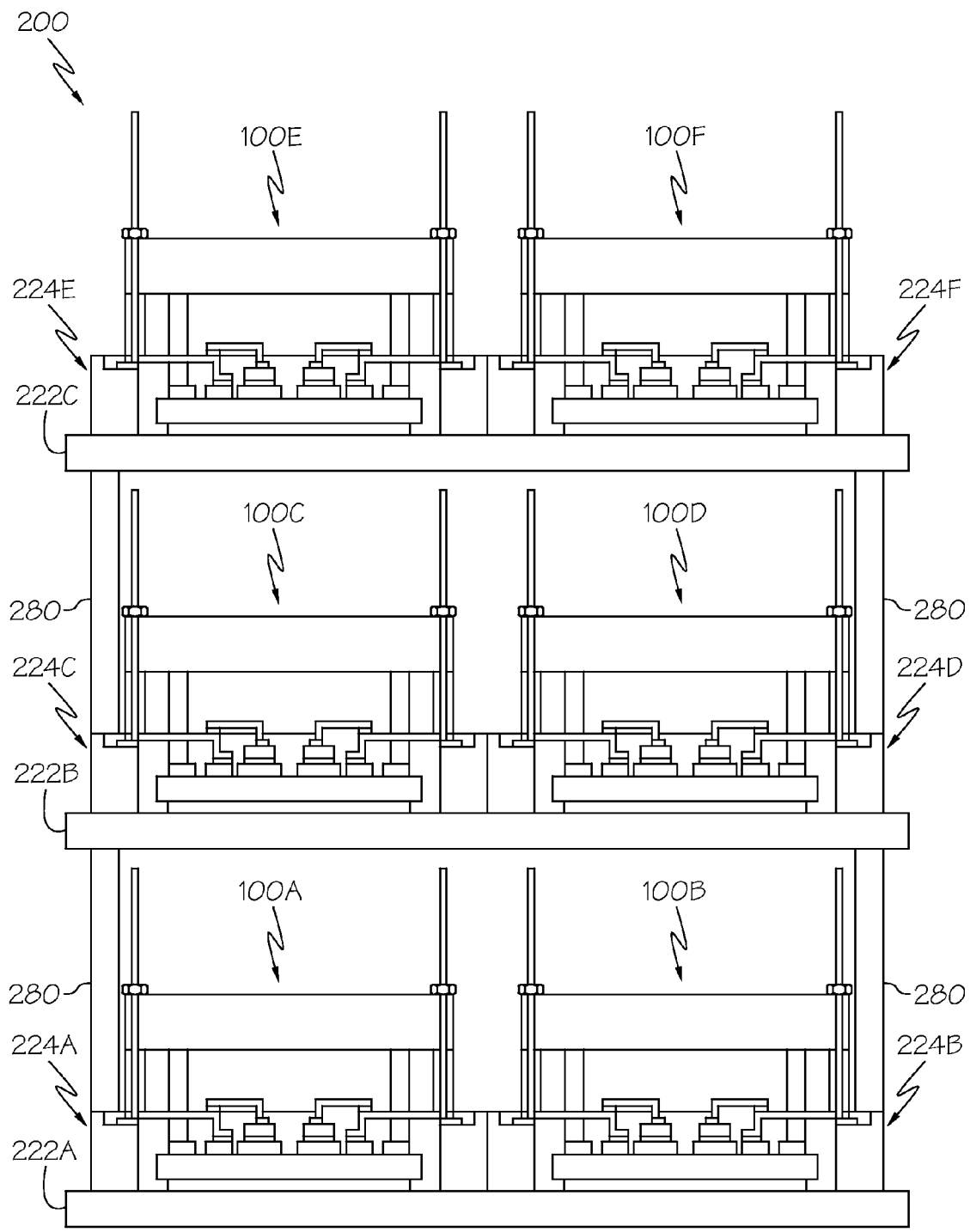
FIG. 6 schematically depicts a power module array according to one or more embodiments described and illustrated herein.

In some embodiments, multiple power modules may be assembled to form an array assembly. FIG. 6 schematically depicts a power module array 200 comprising a plurality of vertically and horizontally arranged power modules 100A-100F. It is noted that a portion of each frame member (i.e., frame members 224A-224F) is removed to depict the high temperature power modules (not numbered) enclosed therein. In the illustrated embodiment, a heat spreader is shared by multiple power modules. For example, first and second power modules 100A, 100B share a first heat spreader 222A of a first module support, third and fourth power modules 100C, 100D share a second heat spreader 222B of a second module support, and fifth and sixth power modules 100E, 100F share a third heat spreader of a third module support. It should be understood that more than two power modules may be arranged horizontally and share a heat spreader.

As shown in FIG. 6, power modules may also be stacked vertically. Frame extension members 280 may be provided between a top surface of a lower frame member and bottom surface of an upper heat spreader. For example, frame extension members 280 may be positioned between a frame member 224A of a first power module 100A and a bottom surface of a second heat spreader 222B, and a frame member 224B of a second power module 100B and the bottom surface of the second heat spreader 222B. Similarly, frame extension members 280 may be positioned between a frame member 224C of a third power module 100C and a bottom surface of a third heat spreader 222C, and a frame member 224D of a fourth power module 100D and the bottom surface of the third heat spreader 222C. In this manner, a plurality of power modules 100A-100E may be arranged horizontally and vertically in a power module array 200.

It should now be understood that embodiments described herein are directed toward power modules, such as high temperature power semiconductor modules, that may be easily assembled and disassembled. Electrically conductive rails provide for both electrical connections and alignment of the various modules. The fixing tools utilized to maintain the power modules in an assembled state do not penetrate any components of the module, and thus minimize pressure-induced stresses. Further, electrically conductive pads embedded in a module support provides for electrical connections despite any misalignments that may be present.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power module comprising:
   a module support comprising:
      a heat spreader comprising a top surface; and
      an electrically conductive rail extending from the module support;
   a high temperature module comprising:
      a module substrate having a semiconductor surface and a heat transfer surface, wherein the heat transfer surface contacts the top surface of the heat spreader, and wherein the heat transfer surface is detachable from the top surface of the heat spreader; and
      a semiconductor device that is thermally coupled to the semiconductor surface of the module substrate and that is electrically coupled to the electrically conductive rail; and
   a module cap comprising:
      a body portion; and
      a post extending from the body portion, wherein the post is configured to press against the semiconductor device such that the heat transfer surface of the module substrate is thermally coupled to the heat spreader.

2. The power module of claim 1, wherein the semiconductor device is electrically coupled to the semiconductor surface.

3. The power module as claimed in claim 1, wherein the module support further comprises an electrically conductive pad that is electrically coupled to the electrically conductive rail.

4. The power module as claimed in claim 1, wherein the module cap further comprises a first post that presses against the module substrate and a second post that presses against the semiconductor device.

5. The power module as claimed in claim 1, wherein the module cap further comprises an outer post, wherein the electrically conductive rail is disposed within the outer post.

6. The power module as claimed in claim 5, wherein the outer post is electrically coupled to the electrically conductive rail.

7. The power module as claimed in claim 1, wherein the high temperature module further comprises an external connector that is electrically coupled to the electrically conductive rail.

8. The power module as claimed in claim 7, wherein the module cap comprises further comprises a first post that presses against the module substrate and a second post that presses against the external connector.

9. The power module as claimed in claim 1, the post is configured to press against a top surface of the semiconductor device.

10. A power module array comprising:
    a first power module and a second power module, each of the first power module and the second power module comprising:
       a module support comprising:
          a heat spreader comprising a top surface; and
          an electrically conductive rail extending from the module support;
       a high temperature module comprising:
          a module substrate having a semiconductor surface and a heat transfer surface, wherein the heat transfer surface contacts the top surface of the heat spreader, and wherein the heat transfer surface is detachable from the top surface of the heat spreader; and
          a semiconductor device that is thermally coupled to the semiconductor surface of the module substrate and that is electrically coupled to the electrically conductive rail; and
       a module cap comprising:
          a body portion; and
          a post extending from the body portion, wherein the post is configured to press against the semiconductor device such that the heat transfer surface of the module substrate is thermally coupled to the heat spreader.

11. The power module array as claimed in claim 10, wherein the module support further comprises an electrically conductive pad that is electrically coupled to the electrically conductive rail.

12. The power module array as claimed in claim 10, wherein the module cap further comprises a first post that presses against the module substrate and a second post that presses against a top surface of the semiconductor device.

13. The power module array as claimed in claim 10, wherein the module cap further comprises an outer post, wherein the electrically conductive rail is disposed within the outer post.

* * * * *